US012604418B2

(12) United States Patent
Maier et al.

(10) Patent No.: US 12,604,418 B2
(45) Date of Patent: Apr. 14, 2026

(54) PRINTED CIRCUIT BOARD ASSEMBLY FOR AN AIRCRAFT SOLID STATE POWER CONTROLLER

(71) Applicant: HS Elektronik Systeme GmbH, Nördlingen (DE)

(72) Inventors: Josef Maier, Munningen (DE); Thomas Gietzold, Unterwilflingen (DE)

(73) Assignee: HS ELEKTRONIK SYSTEME GMBH, Nördlingen (DE)

( * ) Notice: Subject to any disclaimer, the term of this patent is extended or adjusted under 35 U.S.C. 154(b) by 230 days.

(21) Appl. No.: 18/388,031

(22) Filed: Nov. 8, 2023

(65) Prior Publication Data

US 2024/0164025 A1     May 16, 2024

(30) Foreign Application Priority Data

Nov. 10, 2022    (EP) .................................... 22206733

(51) Int. Cl.
*H05K 3/00*          (2006.01)
*B64D 47/00*          (2006.01)
(Continued)

(52) U.S. Cl.
CPC .............. *H05K 3/28* (2013.01); *B64D 47/00* (2013.01); *H05K 1/0284* (2013.01); *H05K 1/14* (2013.01);
(Continued)

(58) Field of Classification Search
CPC .......... H05K 3/28; H05K 1/0284; H05K 1/14; H05K 2201/042; B64D 47/00; B64D 2221/00
See application file for complete search history.

(56) References Cited

U.S. PATENT DOCUMENTS 5,752,047 A     5/1998  Darty et al.
5,938,455 A     8/1999  Glovatsky et al.
(Continued)

FOREIGN PATENT DOCUMENTS

DE          102017208772 A1    11/2018
EP               1672972 A1 *   6/2006    ............. H05K 3/284
(Continued)

OTHER PUBLICATIONS

DE 102016217554 A; published in 2016; English Translation (Year: 2016).*

(Continued)

*Primary Examiner* — Pete T Lee
(74) *Attorney, Agent, or Firm* — CANTOR COLBURN LLP

(57)          ABSTRACT

A printed circuit board assembly for an aircraft solid state power controller (SSPC), comprising at least one printed circuit board having a top side and a bottom side. At least one of the top side and the bottom side has a surface layer made from an electrically conductive material and has a plurality of heat generating electronic circuit components mounted thereon. An insulating potting covers the plurality of heat generating electronic circuit components on the at least one of the top side and the bottom side, the insulating potting comprising an insulating potting body covering the plurality of heat generating electronic circuit components in a contiguous manner.

12 Claims, 8 Drawing Sheets

(51) Int. Cl.

| | |
|---|---|
| *H05K 1/02* | (2006.01) |
| *H05K 1/14* | (2006.01) |
| *H05K 3/28* | (2006.01) |

(52) U.S. Cl.

CPC .... *B64D 2221/00* (2013.01); *H05K 2201/042* (2013.01)

(56) References Cited

U.S. PATENT DOCUMENTS

| | | |
|---|---|---|
| 8,797,756 B2 | 8/2014 | Sporon-Fiedler et al. |
| 9,960,101 B2 | 5/2018 | Milne |
| 10,617,000 B2 | 4/2020 | Du et al. |
| 10,660,236 B2 | 5/2020 | Rush et al. |
| 11,112,839 B2 | 9/2021 | Rush et al. |
| 11,137,214 B2 | 10/2021 | Mayberry et al. |
| 11,139,164 B2 | 10/2021 | Hanft et al. |
| 11,153,965 B1 | 10/2021 | Jennings |
| 2003/0057277 A1 | 3/2003 | Kimura et al. |
| 2007/0279877 A1 | 12/2007 | Dobritz et al. |
| 2013/0288541 A1 | 10/2013 | Nagamine |
| 2015/0116955 A1 | 4/2015 | Tsuji et al. |
| 2021/0061486 A1* | 3/2021 | Brookes .............. G01M 3/3218 |
| 2022/0272842 A1* | 8/2022 | Takizawa ............... H01L 25/16 |

FOREIGN PATENT DOCUMENTS

| | | |
|---|---|---|
| JP | H0547963 B2 | 2/1993 |
| JP | 2013143439 A | 7/2013 |

OTHER PUBLICATIONS

DE 10201204630 A1; English Translation; published in 2012 (Year: 2012).*

Abstract for DE102017208772 (A1), Published: Nov. 29, 2018, 1 page.

Abstract for JP2013143439 (A), Published: Jul. 22, 2013, 2 pages.

Abstract for JPH0547963 (A), Published: Feb. 26, 1993, 1 page.

Extended European Search Report for Application No. 22206733.2, mailed May 12, 2023, 8 pages.

Extended European Search Report for Application No. 22206736.5, mailed May 9, 2023, 8 pages.

\* cited by examiner

PRINTED CIRCUIT BOARD ASSEMBLY FOR AN AIRCRAFT SOLID STATE POWER CONTROLLER

CROSS REFERENCE TO RELATED APPLICATIONS

This application claims priority to European Patent Application No. 22206733.2 filed Nov. 10, 2022, the entire contents of which is incorporated herein by reference.

TECHNICAL FIELD

The present invention relates to a printed circuit board assembly for an aircraft solid state power controller (SSPC).

BACKGROUND

Aircraft SSPCs are devices for controlling (in particular switching on and off), and optionally also converting, the flow of electric energy in an aircraft. Power semiconductor devices, including power transistors, particularly power MOSFETS and IGBTs, are typically assembled to form electronic power switches in an aircraft SSPC which may contain a plurality of such power semiconductor devices and other electronic devices mounted on a printed circuit board.

Controlling and converting power in power semiconductors of the type described above produces significant heat in a solid state power module containing the power semiconductors. In applications like SSPCs heat is usually generated during times when the power switch is conducting and also when switching the power switch. This heat will increase the temperature of the solid state power module to the point of failure of the power switch or other semiconductor devices of the SSPC. Therefore, efficient heat management is a main requirement for electrical equipment using power semiconductors of this type, like power switches. High voltage and current load has an additional impact on SSPCs. Aircraft SSPCs are subject to additional requirements with respect to reliability and robustness with respect to environmental impacts, like electromagnetic compatibility.

Conventionally, in an aircraft SSPCs a plurality of power switches are connected in parallel to share load requirements. Each power switch comprises its own power chip package including the power chip module and a package encapsulating the power chip module and mounting the power chip module to a printed circuit board (PCB) of the SSPC. While this configuration with separate power chip packages for individual power switches allows to keep the amount of heat generated when switching individual power switches below critical thresholds, it also requires a large number of separate power chip packages on a printed circuit board, thus increasing space requirements and limiting power density of the resulting circuit board assembly.

Therefore, it would be beneficial to have an improved configuration for a printed circuit board assembly of an aircraft solid state power controller (SSPC) allowing more efficient assembly and/or better utilization of space while still providing sufficient heat dissipation capability and mechanical stability.

SUMMARY

Disclosed is a printed circuit board assembly formed with at least one printed circuit board on which at least one electronic power switch for use in high performance aircraft power electronic applications is mounted. In one example the aircraft solid state power controller comprises a plurality of electronic power switches mounted on the at least one printed circuit board and forming multiple power distribution channels of the SSPC, in particular parallel power distribution channels.

A first aspect of the present disclosure relates to a printed circuit board assembly for an aircraft solid state power controller (SSPC), comprising at least one printed circuit board having a top side and a bottom side, wherein at least one of the top side and the bottom side has a surface layer made from an electrically conductive material and has a plurality of heat generating electronic circuit components mounted thereon, and wherein an insulating potting covers the plurality of heat generating electronic circuit components on the at least one of the top side and the bottom side, the insulating potting comprising an insulating potting body covering the plurality of heat generating electronic circuit components in a contiguous manner.

A second aspect of the present disclosure relates to a method of manufacturing a printed circuit board assembly for an aircraft solid state power controller (SSPC). The method includes: providing at least one printed circuit board having a top side and a bottom side, at least one of the top side and the bottom side having a surface layer made from an electrically conductive material and having a plurality of heat generating electronic circuit components mounted thereon, and potting an insulating material to the at least one of top side and/or bottom side of the printed circuit board such as to cover the plurality of heat generating electronic components, thereby producing an insulating potting having the configuration of an insulating potting body covering the plurality of heat generating electronic circuit components in a contiguous manner.

Particular embodiments may include any of the following optional features, either separate from each other or in combination, unless specified to be alternatives in the following. The following description of particular embodiments relates to both the printed board assembly according to the first aspect above and the method according to the second aspect above.

By having a circuit board assembly with heat generating electronic circuit components in which the heat generating electronic circuit components are completely covered by a single insulating potting, a much more compact circuit board assembly can be produced than hitherto possible. Moreover, the printed circuit board assembly can have a monolithic configuration, as all the heat generating electronic circuit components of the printed circuit board assembly can be embedded in a single insulating potting. By giving the insulating potting a suitable dimension, it is possible to produce a compact circuit board assembly fulfilling all requirements with respect to mechanical stability and heat dissipation capability.

Particularly, the printed circuit board assembly may form an aircraft SSPC card including at least one aircraft SSPC channel for selectively connecting a load to an aircraft power supply.

Particularly, the heat generating electronic circuit component may be a power semiconductor switch of a respective power distribution channel of the solid state power controller. The power distribution channel, also referred to as SSPC channel, may be configured for selectively supplying an electric load with electric power from a power supply. Particularly, the power semiconductor switch may be configured for selectively switching at least between an OFF condition (also referred to as an isolating condition) in which an electric load connected to a load side of the power semiconductor switch is electrically disconnected from a power supply connected to a supply side of the power semiconductor switch, and an ON condition (also referred to as a conducting condition) in which the electric load is electrically connected to the power supply and supplied with electric power. Particularly the power semiconductor switch may be any of a power metal semiconductor field effect transistor (MOSFET), a power insulated gate bipolar transistor (IGBT), and a power junction field effect transistor (JFET).

The power semiconductor switch particularly may be a power semiconductor chip or die. The power semiconductor switch also may comprise a circuitry of semiconductor chips and passive electronic circuit components. In one example, the power semiconductor switch may be mounted to the printed circuit board by Chip-on-Board technology.

In particular embodiments, the insulating potting may have the configuration of a globtop potting or dam and fill potting. The insulating potting may be formed by any additive manufacturing technique, e.g. by applying polymeric material directly onto the printed circuit board using a dam and fill potting method or 3D printing.

Further, in particular embodiments the insulating potting body may be made from an insulating polymeric material. In particular, the insulating potting body may have the configuration of a dam and fill potting. Particularly, the insulating dam material may be an insulating polymeric material and/or the insulating fill material may be an insulating polymeric material. Particularly, the insulating potting body may comprise an insulating dam material having a viscosity of $50 \times 10^3$ mPas or more, particularly of $100 \times 10^3$ mPas or more, preferably of $110 \times 10^3$ mPas or more, particularly at most $1000 \times 10^3$ mPas, and an insulating fill material having a viscosity of $49 \times 10^3$ mPas or less, particularly of $30 \times 10^3$ mPas or less, preferably of $20 \times 10^3$ mPas or less, particularly of at least 10 mPas. All values of viscosity relate to the viscosity of the insulating dam material and the viscosity of the insulating fill material in a condition when applying the respective insulating dam material or insulating fill material to the printed circuit board.

Further, in particular embodiments the insulating potting may comprise a single insulating potting body forming a contiguous potting covering the top side and/or the bottom side of the printed circuit board. Particularly, the insulating potting body may form a contiguous potting covering the top side and/or the bottom side of the printed circuit board as a whole, including any heat generating electronic components mounted thereon.

In further embodiments, the at least one printed circuit board may be configured to form a male part of a card edge connector in at least one peripheral region thereof.

When forming a male part of a card edge connector, particularly, each of the peripheral regions forming a respective card edge connector may be uncovered by the insulating potting. Particularly, the regions of the printed circuit board forming male parts of a card edge connector may be the only regions of the printed circuit board not covered by the single insulating potting.

Usually, at least one peripheral portion of the printed circuit board (PCB) will be provided with conductive traces leading to an edge region of the printed circuit board, the edge region thus forming a male part of a card edge connector. This peripheral portion forming the card edge connector is intended to be connected with (plugged into) a matching socket of an aircraft SSPC, such that the conductive traces on the printed circuit board electrically connect to conductive traces or wires on the side of the socket. The matching socket thus forms the female part of the card edge connector. A card edge connector is a cost-effective device because the male part of the connector is formed by the edge of the printed circuit board and thus the card edge connector only requires a single discrete female connector. Connectors of such card edge configuration also are fairly robust and durable.

In further particular embodiments, the insulating potting body may be formed with a three dimensional structure on its side facing away from the printed circuit board.

Particularly, the three dimensional structure may include at least one predetermined pattern of protrusions and recesses, thereby forming any of at least one reinforcing rib, at least one grid structure and/or at least one mesh structure, or combinations thereof.

In particular embodiments, the three dimensional structure may be formed by any of: (a) applying to the top side and/or bottom side of the printed circuit board a dam structure using a dam material, such as to form any of at least one reinforcing rib, at least one grid structure and/or at least one mesh structure and filling spaces enclosed by the dam structure with a fill material to a height less than, or at most equal to, the height of the dam structure; (b) applying to the top side and/or bottom side of the printed circuit board a first dam structure using a first dam material, such as to form any of at least one reinforcing rib, at least one grid structure and/or at least one mesh structure and filling spaces enclosed by the first dam structure with a first fill material, thereby forming a first layer; then applying to the first layer a further dam structure using a further dam material or the first dam material, such as to form any of at least one reinforcing rib, at least one grid structure and/or at least one mesh structure, not filling spaces enclosed by the further dam structure with the first fill material or a further fill material, or filling spaces enclosed by the further dam structure with the first fill material or a further fill material to a height less than the height of the further dam structure, thereby forming a further layer; (c) removing material from the insulating potting applied to the top side and/or bottom side of the printed circuit board such as to form any of at least one reinforcing rib, at least one grid structure and/or at least one mesh structure on the side facing away from the printed circuit board; (d) applying material of the insulating potting to the top side and/or bottom side of the printed circuit board and forming any of at least one reinforcing rib, at least one grid structure and/or at least one mesh structure on the side facing away from the printed circuit board in a viscous condition of the applied material, using a stamping or embossing body; or (e) applying material of the insulating potting to the top side and/or bottom side of the printed circuit board and forming any of at least one reinforcing rib, at least one grid structure and/or at least one mesh structure on the side facing away from the printed circuit board using a 3D printing device.

In further particular embodiments, the printed circuit board assembly for an aircraft solid state power controller (SSPC) as described above may comprise an insulating potting on each of the top side and bottom side of the printed circuit board. In such embodiments, the insulating potting on the top side may be formed with a first three dimensional structure on its side facing away from the printed circuit board, and the insulating potting on the bottom side may be formed with a second three dimensional structure on its side facing away from the printed circuit board. Each of the tops side and bottom side may include at least one aircraft SSPC channel.

Particularly, the first and second three dimensional structures can be formed coordinated with each other or complementary to each other. Particularly, the insulating potting on the top side may include a first predetermined pattern of protrusions and recesses and the insulating potting on the bottom side may include a second predetermined pattern of protrusions and recesses coordinated with, or complementary to, the first predetermined pattern of protrusions and recesses.

In further particular embodiments, the printed circuit board assembly for an aircraft solid state power controller (SSPC) as set out above may comprise at least two printed circuit boards stacked above each other. Particularly, the two printed circuit boards may be stacked above each other in such a manner that the coordinated, or complementary, three dimensional structures formed on the bottom side of the upper printed circuit board and formed on the top side of the lower printed circuited board, respectively, form a positive lock with each other.

This configuration with a plurality of printed circuit boards stacked on top of each other while forming a positive lock between adjacent of the printed circuit boards increases stiffness of the assembly of stacked printed circuit boards compared to a printed circuit board assembly having a single printed circuit board, and thus provides favorable mechanical stability. In addition, the stacked assembly is as compact as possible, thus saving space for accommodating an SSPC on an aircraft.

In further particular embodiments, the printed circuit board assembly for an aircraft solid state power controller (SSPC) as set out above further may comprise at least one clamping assembly positioned at a peripheral region of the printed circuit boards stacked above each other and configured to clamp the printed circuit boards together.

In further particular embodiments, the printed circuit board assembly for an aircraft solid state controller (SSPC) further may comprise an aircraft SSPC socket comprising a plurality of plug-in board connectors. Each each of these plug-in board connectors will be provided and configured for accommodating a respective one of the plurality of printed circuit boards, particularly by accommodating the male parts of a card edge connector formed by a peripheral region of the respective printed circuit board as set out above. Particularly, each of these plug-in board connectors of the aircraft SSPC socket forms a female socket of a respective card edge connector, the card edge connector further comprising a corresponding male connector part formed by a peripheral region of one of the plurality of printed circuit boards, as described above. The male connector part formed by a peripheral region of the one of the plurality of printed circuit boards can then be plugged into the corresponding female socket of the aircraft SSPC socket to establish the required electrical connections with respect to power supply, load and/or further controls on the aircraft. Further, in particular embodiments the plug-in board connectors of the aircraft SSPC socket are designed and located in such a manner that each of the printed circuit boards of the stacked printed circuit board assembly can be plugged into its respective plug-in board connector on the aircraft SSPC socket simultaneously with the other printed circuit boards. Specifically, in particular embodiments the plug-in board connectors of the aircraft SSPC socket are designed and located in such a manner that in a situation where two adjacent of the printed circuit boards in the stack are plugged into their respective plug-in board connectors at the same time, a clamping force is exerted by the aircraft SSPC socket which urges the two printed circuit boards into a friction locking interaction and/or into a positive locking interaction with each other. Thereby, the aircraft SSPC socket also acts as a clamping device. In this way, in particular embodiments the aircraft SSPC socket is configured to clamp adjacent two of the printed circuit boards together on one side thereof.

The aircraft SSPC socket may be produced relatively simply. Particularly, the aircraft SSPC socket may be made from a polymeric material which can be handled by usual forming techniques, in particular by injection molding or pressure molding.

Particularly, the aircraft SSPC socket may be made as a one-piece structure, e.g. by injection molding or compression molding. Thus, the aircraft SSPC socket may be provided in a number of different configurations, configured for accommodating different numbers of printed circuit boards and/or configured for accommodating printed circuit boards of different sizes and/or card edge connector layouts.

In further embodiments, the clamping assembly may comprise a further clamping device on the side of the printed circuit boards opposite to the connectors (male parts of card edge connectors) connected to the aircraft SSPC socket.

BRIEF DESCRIPTION OF THE FIGURES

The invention will be described in more detail in the following with respect to the accompanying figures in which.

DETAILED DESCRIPTION

Figure 1:
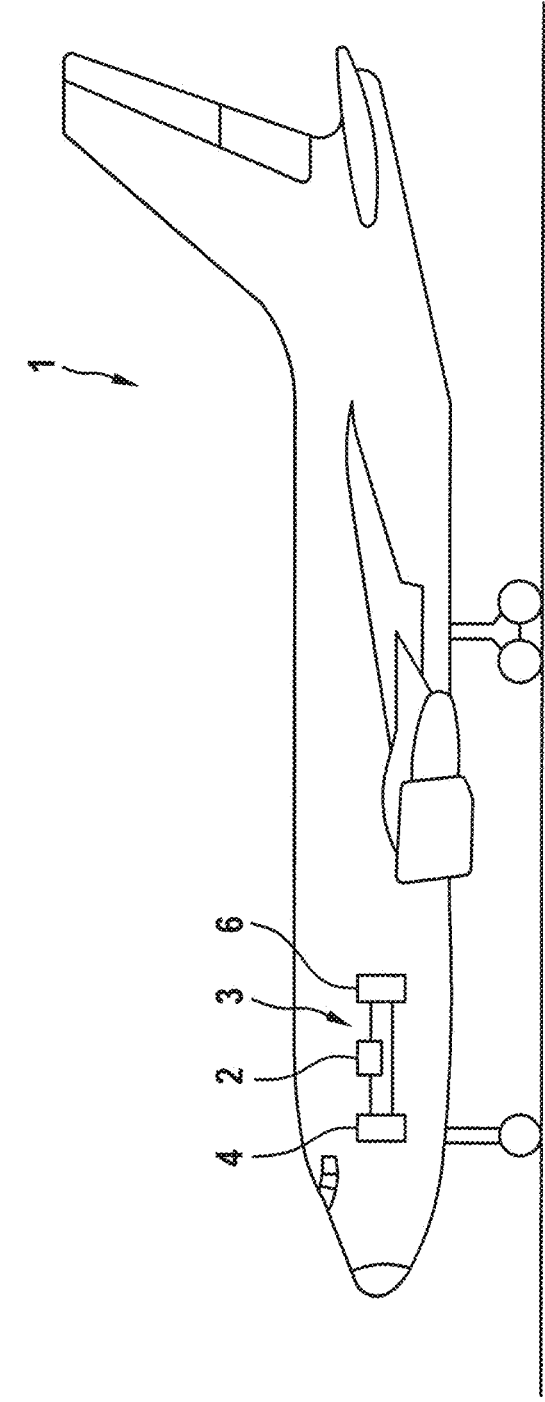
FIG. 1 shows a schematic side view of an aircraft equipped with an aircraft electric power supply system including an aircraft solid state power controller (SSPC) comprising a printed circuit board assembly according to an exemplary embodiment of the invention.

In the following detailed description, a number of specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing figures. Where multiple embodiments are disclosed and described, having some features in common, for clarity and ease of illustration, description, and comprehension thereof, similar and like features one to another will ordinarily be described with like reference numerals. Such features will only be described with respect to the first figure in which the respective feature occurs. The same description applies with respect to the same features in other figures.

The term "horizontal" as used herein is defined as a plane parallel to the conventional plane or surface of the printed circuit board or package top, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

FIG. 1 shows a schematic side view of an aircraft comprising an aircraft electric power supply system including an aircraft solid state power controller (SSPC) according to an exemplary embodiment of the invention.

FIG. 1 shows an aircraft 1, in particular an airplane, which is equipped with an aircraft electric power supply system 3 including an aircraft electric power supply 4, an electric load 6, and an aircraft solid state power controller (SSPC) 2. The aircraft SSPC 2 comprises at least one printed circuit board assembly 10 according to an exemplary embodiment of the invention. The aircraft SSPC 2 is configured for controlling the supply of electric power from the aircraft electric power supply 4 to the electric load 6.

Although the aircraft electric power supply system 3 is depicted in FIG. 1 as including only a single aircraft electric power supply 4, a single electric load 6, and a single aircraft SSPC 2, respectively, it is to be understood that this a highly simplified version for illustrative purposes. In reality, embodiments of the aircraft electric power supply system 3 may comprise a plurality of each of the above mentioned components, respectively.

An aircraft electric power supply system 3 may in particular include a plurality of aircraft SSPCs 2, wherein each aircraft SSPC 2 includes numerous aircraft SSPC channels. Each aircraft SSPC channel is assigned to a respective load and configured for controlling the supply of electric power from the aircraft electric power supply 4 to the electric load 6. Each aircraft SSPC 2, or each SSPC channel of an aircraft SSPC 2 with multiple SSPC channels, comprises at least one power semiconductor switch (see FIG. 7, "Die 1" designated by 32) for selectively switching the electric load 6 at least between an OFF condition in which the electric load 6 is disconnected from the power supply 4, and an ON condition in which the electric load 6 is connected to the power supply 4 and supplied with electric power. The power semiconductor switch of an SSPC channel is an active electric circuit component as it changes its operative condition depending on control signals applied thereto. The power semiconductor switch of an SSPC channel may be provided in the configuration of a chip or die mounted to a printed circuit board, e.g. by Chip-on-Board technology. In the context of the present disclosure the power semiconductor switch of an SSPC channel will particularly have the configuration of a "naked" chip or die, i.e. a chip or die mounted to the printed circuit board without being embedded in any form of package.

The power semiconductor switch is an example for a heat generating electronic circuit component. The power semiconductor switch may be associated with a respective power distribution channel of the SSPC 2, particularly for switching a load between the ON condition and the OFF condition. The power semiconductor switch may be any of a field effect transistor (FET), in particular a power metal semiconductor field effect transistor (MOSFET), a power insulated gate bipolar transistor (IGBT), and a power junction field effect transistor (JFET). The power semiconductor switch is not depicted in FIGS. 1 to 5. Because of its ON resistance, the power semiconductor switch creates heat when switched to its ON condition, i.e. when allowing electric current to flow from the power supply side to the load side of the power semiconductor switch. The power semiconductor switch also creates heat in the course of switching operations.

Figure 5:
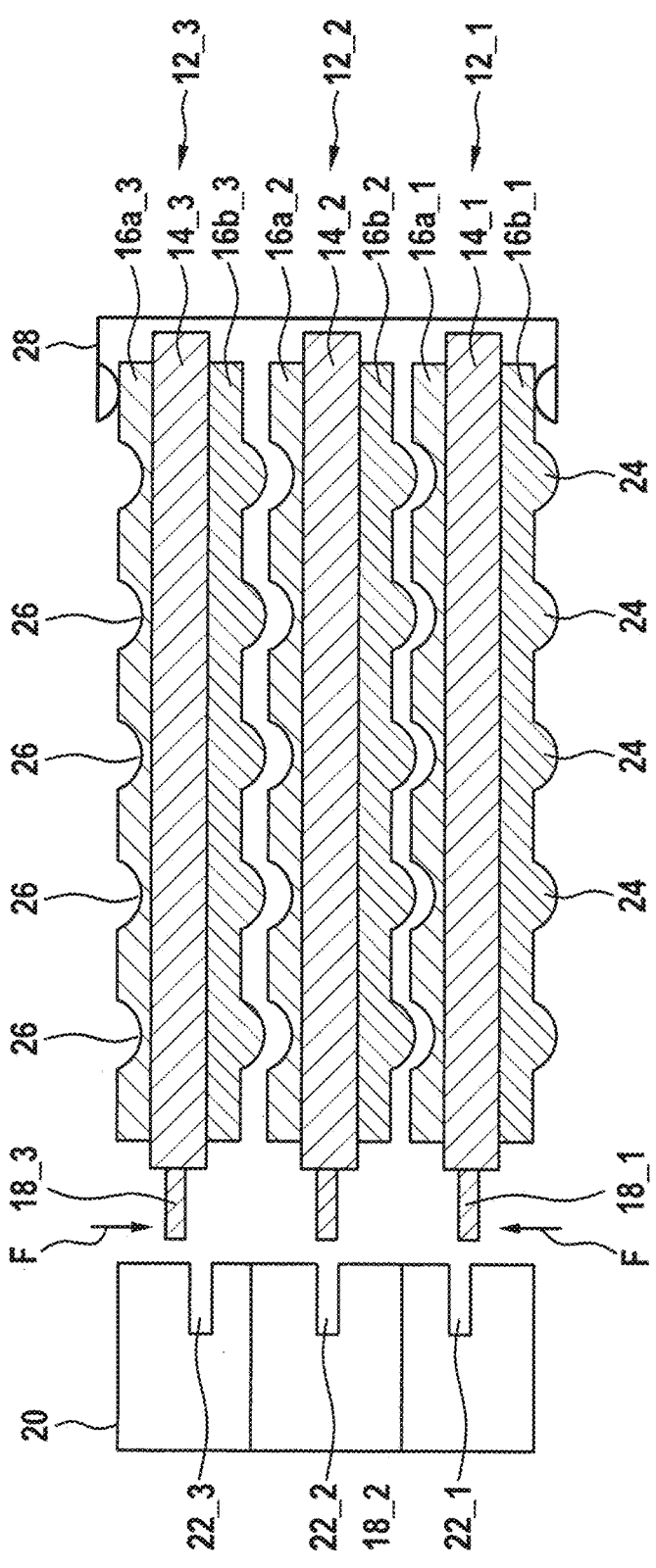
FIG. 5 shows a schematic cross sectional view of a stack of three printed circuit boards similar to FIG. 3 and a corresponding aircraft SSPC socket of the type shown in FIG. 4, in a situation just before connecting the printed circuit boards to the aircraft SSPC socket.
Figure 6:
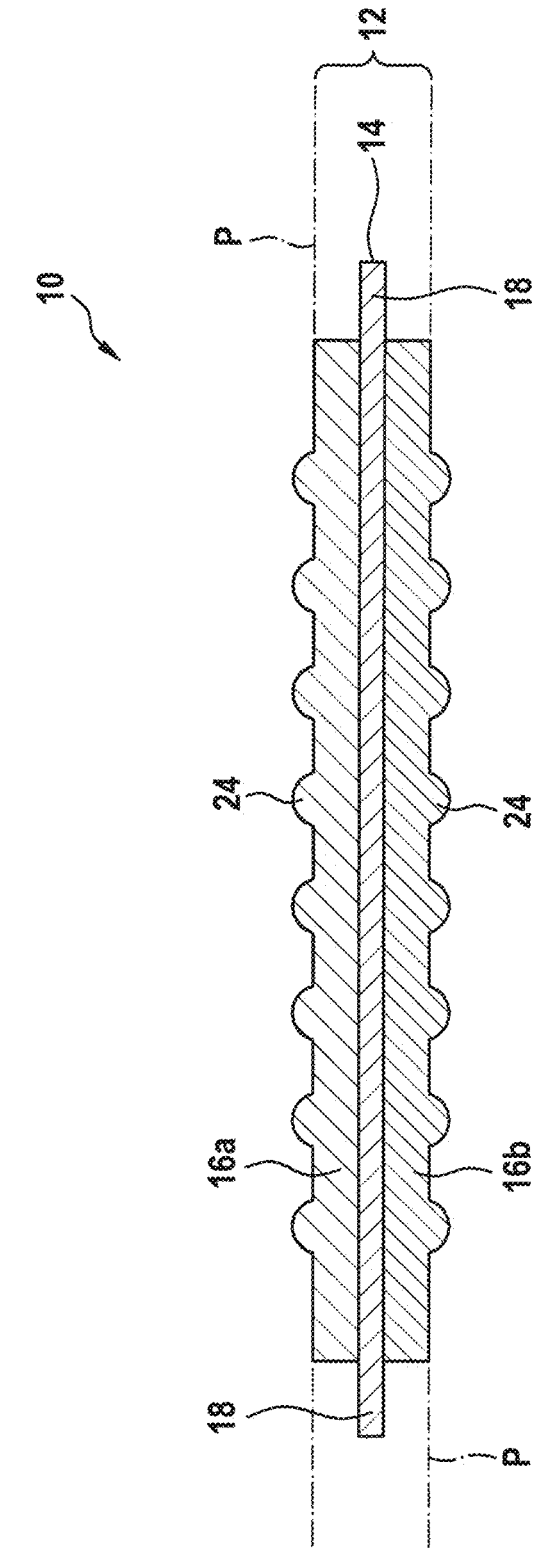
FIG. 6 shows a schematic cross sectional view of a printed circuit board assembly according to a further embodiment provided with an insulating potting having a three dimensional surface structure to increase heat dissipation.

The aircraft SSPC 2, or a respective SSPC channel, may comprise further electric circuit components, in particular electric circuit components for driving and/or controlling the power semiconductor switch. These additional electric circuit components are not explicitly depicted in FIGS. 1 to 5. The component shown to the right of the power semiconductor switch ("die 1") in FIG. 6 is an example for such an additional electric circuit component. Also, additional electric circuit components may create heat during operation, even in case of merely passive electric circuit components.

The power semiconductor switch is mounted to a printed circuit board 14. The printed circuit board 14 mechanically supports the power semiconductor switch and potential additional electric components for driving the power semiconductor switch. The printed circuit board 14 further provides electric connections to the power semiconductor switch by conductive paths formed on or within the printed circuit board 14. The printed circuit board 14 may be formed from an electrically insulative material, e.g. polyimide. Also, a layer providing an insulating interface may be formed between the power semiconductor switch and the printed circuit board 14, particularly in case of a printed circuit board made from, or comprising, an electrically conductive material. The layer providing the insulating interface may be provided with conductive patterns on its side facing the power semiconductor switch for allowing direct copper bonding ("DCP") of the solid state switch to the printed circuit board 14.

The printed circuit board 14 may also serve a heat sink for dissipating thermal energy from heat generating electric circuit components, e.g. from the power semiconductor switch.

Typically, printed circuit boards 14 for an aircraft SSPC as described herein are made from a polymeric material, like polyimide. These printed circuit boards are economically attractive and offer low weight. However, they have a relatively low thermal heat dissipation capability.

The power semiconductor switch may be provided with further cooling measures, such as an external heat sink, which is configured for enhancing the dissipation of thermal energy from the power semiconductor switch. The external heat sink may be a passive heat sink, in particular a cooling body, which provides an extended heat dissipation surface for dissipating heat from the power semiconductor switch to air. Alternatively, the heat sink may be an active heat sink, i.e. a heat sink that is a heat exchanger part of a cooling system, which allows for actively cooling of the power semiconductor switch by exchange of thermal energy with a cooling fluid flowing in the active cooling system. The cooling system may, for example, comprise a fluid cooling medium, such as water or air, which may be circulated through the heat sink and an external heat exchanger for dissipating heat from the power semiconductor switch. Such cooling measures tend to increase complexity and size of the SSPC considerably. Embodiments of the present disclosure provide better solutions allowing to realize sufficient thermal heat dissipation capability of a printed circuit board assembly of an aircraft power distribution system.

Figure 2:
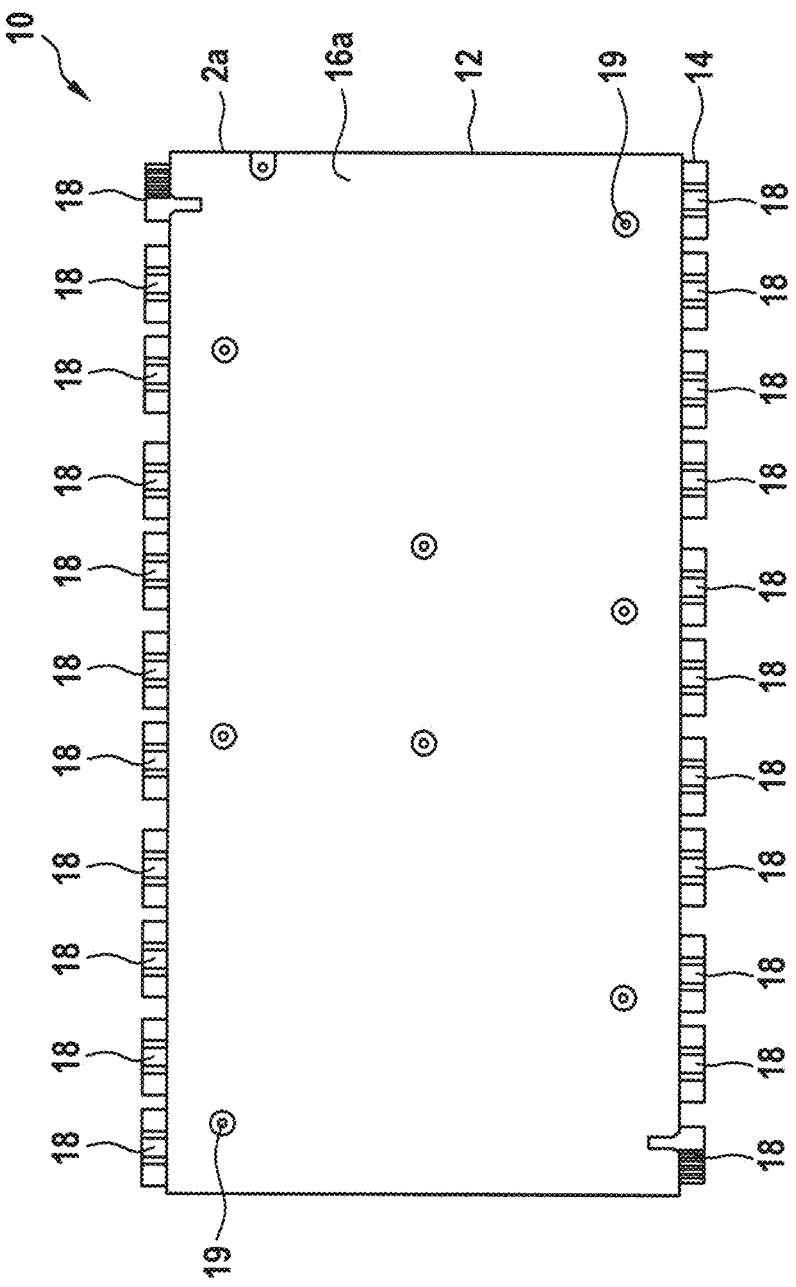
FIG. 2 shows a schematic top view of a printed circuit assembly according to an embodiment.

FIG. 2 shows a schematic top view of a printed circuit board assembly 10 according to an embodiment. The printed circuit board assembly 10 may form each of the configurations of an aircraft SSPC 2 mentioned above. In the two simplest forms, the printed circuit board assembly 10 forms an aircraft SSPC 2 merely having one SSPC channel formed on one side of the printed circuit board assembly 10 (e.g. on the top side shown in FIG. 2), or for forming an aircraft SSPC 2 having two SSPC channels, each SSPC channel formed on one of opposite sides of the printed circuit board assembly 10 (i.e. one SSPC channel may be formed on the top side shown in FIG. 2 and the other SSPC channel may be formed on the bottom side (not visible in FIG. 2). However, the printed circuit board assembly 10 can also form an aircraft SSPC 2 having a plurality of SSPC channels formed on one side of the printed circuit board assembly 10 (e.g. on the top side shown in FIG. 2), or for forming an aircraft SSPC having a plurality of SSPC channels formed on each of opposite sides of the printed circuit board assembly 10 (i.e. a plurality of SSPC channels are formed on the top side shown in FIG. 2 and a plurality of SSPC channels are formed on the bottom side (not visible in FIG. 2). In such much more space efficient configurations, the printed circuit board assembly 10 may be considered as including a first SSPC circuit 2a including all SSPC channels formed on one side of the printed circuit board assembly 10 (e.g. on the top side shown in FIG. 2), and a second SSPC circuit 2b including all SSPC channels formed on the opposite side of the printed circuit board assembly 10 (e.g. on the bottom side, not visible in FIG. 2, as it is on the backside). The number of SSPC channels formed on each side of the printed circuit board assembly 10 s not specifically limited and may be selected as large as desired.

In the embodiment of FIG. 2, the printed circuit board assembly 10 comprises a single SSPC card 12 including a printed circuit board 14 and two SSPC circuits 2a and 2b on opposite sides thereof. Each of the SSPC circuits 2a, 3b forms at least one SSPC channel. The SSPC card 12 may be a plug-in card, for example. The SSPC card 12 is made from a printed circuit board 14 having a respective insulating potting 16a, 16b applied to at least one of its opposite horizontal surfaces on the top side (shown in the top view of FIG. 2) and bottom side (not visible in the top view of FIG. 2) of the printed circuit board 14, particularly to each of its opposite horizontal surfaces on the top side and bottom side of the printed circuit board 14. As FIG. 2 is a top view, only the insulating potting 16a applied to the top side 16a of the printed circuit board 14 is visible. See the cross sectional view of FIG. 5 showing both insulating pottings 16a and 16b. Each of the insulating pottings 16a and 16b covers essentially the whole surface of the printed circuit board 14 on the top side or bottom side in a contiguous manner, i.e. the whole surface of the printed circuit board 14 on the top side and/or bottom side is covered by a respective insulating potting 16a, 16b, except for peripheral regions 18 thereof which do form male parts of a card edge connector, respectively. At least, the insulating potting 16a, 16b on each side completely covers or embeds all heat generating electric circuit components, particularly all chips or dies of the power semiconductor switches, that are mounted on that surface of the printed circuit board 14.

Each of the surfaces on the top side and bottom side of the printed circuit board 14 is provided with a predetermined pattern of conductive traces and has electronic circuit components mounted thereon to form a respective SSPC circuit 2a or 2b, before insulating pottings 16a, 16b are applied. The electronic circuit components mounted on each side of the printed circuit board 14, including the chips or dies of the power semiconductor switches of each SSPC channel, are completely embedded in the respective potting 16a or 16b applied to the top or bottom surface of the printed circuit board 14. The conductive traces formed on the surfaces of the printed circuit board 14 are also largely embedded in the respective potting 16a or 16b, except for specific peripheral regions 18 in which the printed circuit board 14 forms male parts of card edge connectors, as set out in more detail below. Further exception regions in which the printed circuit board 10 is not covered by the insulating potting 16a or 16b are localized recess regions 19 which are free from insulating potting 16 in order to allow electrical contact to the conductive paths formed on the printed circuit board 14 and/or allowing to fix mounting structures, e.g. mounting stamps, for fixing the printed circuit board 14 to a mounting structure, like a frame.

Thus, the insulating pottings 16a, 16b provide for electrical insulation of the SSPC circuits 2a, 2b formed on the surfaces of the printed circuit board 14 on its top side and bottom side, respectively, particularly with respect to the power semiconductor switches of the SSPC channels formed by the SSPC circuits 2a, 2b, respectively. The insulating pottings 16a, 16b also help to increase electromagnetic compatibility of the SSPC 2, or the respective SSPC circuit 2a, 2b, formed by the printed circuit board assembly 10.

In addition to providing electric insulation and improving electromagnetic compatibility, the insulating pottings 16a, 16b are also capable of dissipating thermal energy from heat generating electric circuit components embedded by the respective insulating potting 16a, 16b. Thereby, insulating pottings 16a, 16b help to reduce, or even eliminate, additional cooling measures, like external heat sinks or active cooling systems. Insulating pottings 16a, 16b are particularly effective in dissipating heat in case they have a larger surface area exposed to the environment. It is also beneficial to prepare the insulating pottings from a material having good thermal conduction characteristics and thermal capacity.

As each of the insulating pottings 16a and 16b covers essentially the whole surface of the printed circuit board 14 on the top side or bottom side in a contiguous manner, the insulating pottings 16a and 16b also considerably increase the stiffness of printed circuit board 14 and thereby improve mechanical stability of the SSPC card 12 formed with the printed circuit board 14 and the insulating pottings 16a, 16b applied to opposite sides thereof, compared to mechanical characteristics of the printed circuit board 14 alone or an assembly formed a mounting a number of discrete electric circuit components to the printed circuit board 14.

To achieve good thermal dissipation capabilities and improve mechanical stability of the SSPC card 12, in addition to providing electric insulation, the insulating pottings 16a, 16b may be made from insulating polymer materials.

In order to improve electromagnetic compatibility, the insulating pottings 16a, 16b may be provided with a layer having electrically shielding characteristics, e.g. a metallic layer or a mesh of metallic material. This electromagnetic shield layer may be applied to the surface of the insulating potting 16a, 16b, e.g. as a coating, or may be embedded in the insulating pottings 16a, 16b.

The peripheral regions 18 of the printed circuit are uncovered by the insulating pottings 16a, 16b, such that conductive traces formed on the respective top and bottom side of the printed circuit board 14 extend to the edges of the peripheral regions 18 thereby forming male parts of a card edge connector, respectively. By plugging the male parts of the card edge connectors formed by the peripheral regions 18 into corresponding female sockets, an electrical contact can be realized for connecting the respective SSPC channels to their respectively assigned power supplies and loads, and also establishing further contacts for other purposes (e.g. control lines, data lines, etc.). FIG. 2 shows that 11 peripheral regions 18 are formed along the long edges of the printed circuit board 14, respectively, namely 11 peripheral regions 18 along the upper edge in FIG. 2 and further 11 peripheral regions 18 along the lower edge in FIG. 2. Each pair of these peripheral regions 18 may be assigned to one of the SSPC channels of the respective aircraft SSPC circuit 2a or 2b. It is of course possible to have less, or even more, than 11 peripheral regions 18 forming male parts of card edge connectors along one edge of the printed circuit board 14. It is also possible to have peripheral regions 18 forming male parts of card edge connectors only along one of the upper edge and bottom edge, but not along the opposite edge. Instead of the long edges, or in addition, male parts of card edge connectors may also be formed along the short edges of the printed circuit board 14.

Also, a number of small recesses 19 are formed in inner regions or other peripheral regions of the insulating pottings 16a, 16b on the top side and bottom side of the printed circuit board 14, respectively, allowing to establish a limited number of further electrical contacts to the first or second SSPC circuits 2a, 2b or allowing to connect mounting structures, like mounting stamps, to the SSPC card 12.

Figures 3, 4:
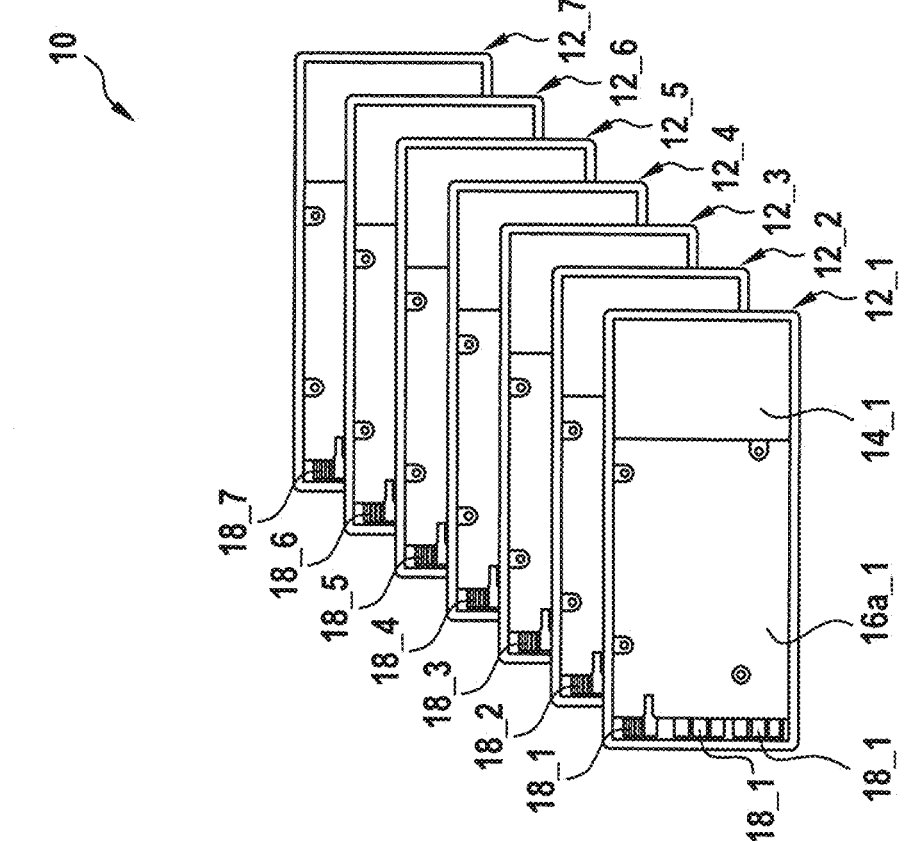
FIGS. 3 and 4 show a schematic perspective views of an embodiment of a printed circuit board assembly comprising a plurality of printed circuit boards stacked above each other, in a situation before connecting the printed circuit boards with a corresponding aircraft SSPC socket.

FIGS. 3 and 4 show schematic perspective views of an embodiment of a printed circuit board assembly 10 comprising a plurality of SSPC cards 12_1 to 12_7 stacked above each other (shown in FIG. 3), in a situation before connecting the SSPC cards 12_1 to 12_7 to a corresponding aircraft SSPC socket 20 (which shown in FIG. 4).

In the embodiment of FIGS. 3 and 4, the printed circuit board assembly 10 comprises seven SSPC cards 12_1 to 12_7. In the same way as described with respect to FIG. 2, each of the SSPC cards 12_1 to 12_7 includes two SSPC circuits 2a and 2b on opposite sides thereof. Each of the SSPC cards 12_1 to 12_7 is made from a printed circuit board 14_1 to 14_7 having a respective insulating potting 16a_1 to 16a_7, 16b_1 to 16b_7 applied to each of its opposite surfaces on the top side and bottom side of the respective printed circuit board 14_1 to 14_7 (in FIG. 3 only the insulating potting 16a_1 applied to the top side of the first printed circuit board 14_1 is designated). Each of the insulating pottings 16a_1 to 16a_7 and 16b_1 to 16b_7 covers essentially the whole surface of the respective printed circuit board 14_1 to 14_7 on the top or bottom side in a contiguous manner, i.e. the whole surface of the printed circuit board 14_1 to 14_7 on the top side and/or bottom side is covered by a respective insulating potting 16a_1 to 16b_7, 16b_1 to 16b_7, except for peripheral regions 18_1 to 18_7 thereof which do form male parts of a card edge connector, respectively. At least, the insulating potting 16a_1 to 16a_7, 16b_1 to 16b_7 on each side of the printed circuit boards 14_1 to 14_7 completely covers all heat generating electric circuit components, particularly all chips or dies of the power semiconductor switches, that are mounted on the respective surface of the respective printed circuit board 14_1 to 14_7.

The peripheral regions 18_1 to 18_7 are uncovered by the insulating pottings 16a_1 to 16a_7, 16b_1 to 16b_7, respectively, such that conductive traces formed on the respective top and bottom side of the printed circuit board 14_1 to 14_7 extend to the edges of the peripheral regions 18_1 to 18_7. By plugging the male parts of the card edge connectors formed by the peripheral regions 18_1 to 18_7 into corresponding female sockets 22_1 to 22_7 formed in the SSPC socket 20 (see FIG. 4), an electrical contact can be realized for connecting the respective SSPC channels to their respectively assigned power supplies and loads, and also establishing further contacts for other purposes (e.g. control lines, data lines, etc.). FIG. 3 shows that three peripheral regions 18_1 to 18_7 are formed along one of the shorter edges of each SSPC card 12_1 to 12_7 (in FIG. 3 along the left edge). Two of these peripheral regions 18_1 may be assigned to one of the SSPC channels formed on the respective aircraft SSPC circuit 2a or 2b. One of these peripheral regions 18_1 is used to establish electrical connections for other functions, e.g. control lines, data lines, etc. It is of course possible to have less, or even more, than three peripheral regions 18_1 forming male parts of a card edge connector along one edge of the printed circuit boards 14_1 to 14_7.

The printed circuit board assembly 10 for an aircraft solid state controller (SSPC) further comprises an aircraft SSPC socket 20, as shown in FIG. 4. The aircraft SSPC socket 20 comprises a plurality of plug-in board connectors 22_1 to 22_7 (in FIG. 4, the SSPC socket 20 comprises seven plug-in board connectors, as the number of SSPC cards 12_1 to 12_7 is also seven). These plug-in board connectors 22_1 to 22_7 are provided and configured for accommodating respective ones of the plurality of SSPC cards 12_1 to 12_7, namely the male part of a card edge connector formed by the peripheral portion 18_1 to 18_7 of the printed circuit board 14_1 to 14_7 of the respective plug-in board connector 12_1 to 12_7. Each of these plug-in board connectors 22_1 to 22_7 of the aircraft SSPC socket 20 forms a female socket of a respective card edge connector, the card edge connector further comprising a corresponding male connector part formed by a peripheral region 18_1 to 18_7 of one of the plurality of printed circuit boards 14_1 to 14_7, as described above. The male connector part formed by a peripheral region 18_1 to 18_7 of the one of the plurality of printed circuit boards 14_1 to 14_7 can then be plugged into the corresponding female socket 22_1 to 22_7 of the aircraft SSPC socket 20 to establish the required electrical connections with respect to power supply 4, load 6 and/or further controls on the aircraft 1.

As best visible in FIG. 5, the plug-in board connectors 22_1 to 22_7 of the aircraft SSPC socket 20 are designed and located in such a manner that each of the SSPC cards 12_1 to 12_7 (each SSPC card 12 comprising its corresponding printed circuit board 14 with insulating pottings 16a, 16b applied to both sides of the printed circuit board 14) of the stacked printed circuit board assembly 10 can be plugged into its respective plug-in board connector 22_1 to 22_7 on the aircraft SSPC socket 20 simultaneously with the other SSPC cards 12_1 to 12_7. In a situation where two adjacent of the SSPC cards 12_1 to 12_7 in the stack are plugged into their respective plug-in board connectors 22_1 to 22_7 at the same time, a clamping force (see arrows F in FIG. 5) is exerted by the aircraft SSPC socket 20 to the SSPC cards 12_1 to 12_2 via the peripheral regions 18_1 to 18_7, respectively, which urges the two adjacent SSPC cards 12_1 to 12_7 into a friction locking interaction and/or into a positive locking interaction with each other. Thereby, the aircraft SSPC socket 20 also acts as a clamping device configured to clamp adjacent two of the SSPC cards 12_1 to 12_7 together on one side thereof.

The aircraft SSPC socket 20 is made from a polymeric material which can be handled by usual forming techniques, in particular by injection molding or pressure molding. The aircraft SSPC socket 20 is made as a one-piece structure by injection molding or compression molding.

Although the aircraft SSPC socket 20 in FIG. 4 is shown in a configuration with seven plug-in connectors, the aircraft SSPC socket 20 may be provided in a number of different configurations, configured for accommodating different numbers of SSPC cards 12 and/or configured for accommodating SSPC cards 12 made from printed circuit boards 14 of different sizes and/or having different card edge connector layouts. For example, FIG. 5 shows an example of an SSPC socket 20 having only three plug-in board connectors 22.

FIG. 5 shows a schematic cross sectional view of a stack of three printed circuit boards 14_1, 14_2, 14_3 forming SSPC cards 12_1, 12_2, 12_3 according to FIG. 3 and a corresponding aircraft SSPC socket 20 as shown in FIG. 4, in a situation before connecting peripheral portions 18_1, 18_2, 18_3 of the printed circuit boards 14_1, 14_2, 14_3 to their corresponding plug-in board connectors 22_1, 22_2, 22_3 of the aircraft SSPC socket. The same reference signs are used in FIG. 5 as in FIGS. 3 and 4. Only features shown in FIG. 5, but not shown in FIG. 3/4 are described in the following. For other features, reference is made to the description of FIGS. 3 and 4 to avoid replication.

As evident from FIG. 5, the plug-in board connectors 22_1, 22_2, 22_3 are positioned in the SSPC socket 20 in such distances to each other that in a configuration where the three SSPC cards 12_1, 12_2, 12_3 have been plugged into their corresponding plug-in board connector 22_1, 22_2, 22_3, respectively, each pair of adjacent of the SSPC cards 12_1, 12_2, 12_3 in the stack (i.e. SSPC cards 12_1/12_2 forming a first pair, SSPC cards 12_2/12_3 forming a second pair) are no longer distant from each other, but rather abut each other and even are pressed against each other by a clamping force exerted by the respective plug-in card connectors 22_1, 22_2, 22_3 of the SSPC socket 20 to the pair of SSPC cards 12_1, 12_2, 12_3 via engagement of the respective plug-in board connectors 22_1, 22_2, 22_3 with the peripheral portions 18_1, 18_2, 18_3 of the printed circuit boards 14_1, 14_2, 14_3. As a result, all three SSPC cards 12_1, 12_2, 12_3 are pressed against each other by the SSPC socket 20 to form a compact and unitary body of stacked SSPC cards 12_1, 12_2. 12_3. The unitary and compact body of stacked SSPC cards 12_1, 12_2, 12_3 is held together by frictional interaction and/or positive locking interaction between each pair of adjacent SSPC cards 12_1 and 12_2; or 12_2 and 12_3, in presence of the clamping force exerted by the aircraft socket 20. (see arrows F in FIG. 5). Particularly, the clamping force exerted by the aircraft SSPC socket 20 via the plug-in card connectors 22_1 and 22_2 of the SSPC socket 20 to the SSPC cards 12_1 and 12_2 via the peripheral regions 18_1 and 18_2 respectively, urges the two adjacent SSPC cards 12_1 and 12_2 into a friction locking interaction and/or into a positive locking interaction with each other. The same considerations apply with respect to the clamping force exerted by the aircraft SSPC socket 20 via the plug-in card connectors 22_2 and 22_3 of the SSPC socket 20 to the pair of adjacent SSPC cards 12_2 and 12_3 via the peripheral regions 18_2 and 18_3, respectively. Also, this clamping force urges the two adjacent SSPC cards 12_2 and 12_3 into a friction locking interaction and/or into a positive locking interaction with each other. Thereby, the aircraft SSPC socket 20 acts as a clamping device configured to clamp the adjacent three SSPC cards 12_1, 12_2, and 12_3 together to form a single monolithic and integral block of SSPC cards 12_1, 12_2, 12_3. The stiffness, robustness and other physical properties of such block of SSPC cards 12_1, 12_2, and 12_3 is larger than the mere sum of stiffnesses of the three SSPC cards 12_1, 12_2, 12_3, due to the friction locking interaction and/or positive locking interaction between the upper insulating potting 16b_1 of the first SSPC card 12_1 with the lower insulating potting 16b_2 of the second SSPC card 12_2, and the friction locking interaction and/or positive locking interaction between the upper insulating potting 16b_2 of the second SSPC card 12_2 with the lower insulating potting 16b_3 of the third SSPC card 12_3.

In the embodiment shown in FIGS. 3 and 4 an interaction by frictional engagement between each pair of adjacent SSPC cards 12 is possible, because the insulating pottings 16a, 16b applied to both sides of each printed circuit board 14 have a smooth, or at least unstructured, outer surface (outer surface refers to the surface of the insulating pottings 16a, 16b opposite to the printed circuit board 14).

FIG. 5 shows an embodiment in which between each pair of adjacent SSPC cards 12, in addition to an interaction by frictional engagement, also an interaction by positive locking engagement will occur between each pair of adjacent SSPC cards 12 (e.g. in FIG. 5 between the upper insulating potting 16a_1 of the first SSPC card 12_1 and the lower insulating potting 16b_2 of the second SSPC card 12_2, as well as between the upper insulating potting 16a_2 of the second SSPC card 12_2 and the lower insulating potting 16b_3 of the third SSPC card 12_3). In the embodiment of FIG. 5, the insulating pottings 16a, 16b applied to both sides of a respective printed circuit board 14 are provided with structured outer surfaces. These structured outer surfaces have the form of predefined protrusions 24 and recesses 26 formed on the outer surfaces of the insulating pottings 16a, 16b. In FIG. 5, only some of the protrusions 24 formed on the outer surface of the insulating potting 16b_1 applied to the bottom surface of the printed circuit board 14_1 of the first SSPC card 12_1 are provided with reference signs 24 exemplarily, and only some of the recesses 26 formed on the outer surface of the insulating potting 16a_3 applied to the top surface of the printed circuit board 14_3 of the third SSPC card 12_3 are provided with reference signs 26 exemplarily. It is to be understood that the same reference signs 24 should apply to the protrusions formed in the insulating pottings 16b_2 and 16b_3 of the other SSPC cards 12_2 and 12_3, as well as the same reference signs 26 should apply to the recesses formed in the insulating pottings 16a_1 and 16a_2 of the other SSPC cards 12_1 and 12_2.

As can be seen in FIG. 5, for each of the SSPC cards 12_1, 12_2, 12_3 the configuration of a patterned structure with protrusions 24 and recesses 26 formed on the outer surfaces of the insulating pottings 16a and 16b applied to opposite sides of the respective printed circuit board 14 is coordinated with each other. This coordination of the patterned structure of the insulating pottings 16a, 16b allows to stack a number of SSPC cards 12 upon each other in a manner in which the insulating potting 16b formed on the bottom side of an upper SSPC card 12 engages with the insulating potting 16a formed on the top side of a lower (but adjacent) SSPC card 12.

Particularly, recesses 26 are formed on the outer surfaces of the insulating pottings 16a or 16b applied to one of the top side and bottom side of a respective printed circuit board 14 (in FIG. 5 recesses 26 are formed on the outer surfaces of the insulating potting 16a applied to the top side of the printed circuit boards 14, respectively). Protrusions 24 are formed on the outer surface of the other of the insulating pottings 16a, 16b applied to the top side or bottom side of a respective printed circuit board 14 (in FIG. 5 protrusions 24 are formed on the outer surface of the insulating potting 16b applied to the bottom side of the printed circuit boards 14, respectively).

Moreover, the protrusions 24 and recesses 26 have a shape or profile coordinated with, or complementary to, each other (e.g. the protrusions 24 form domes of half circular shape in cross section, while the recesses 26 form depressions of the same half circular shape in cross section, as indicated in FIG. 5). Thus, each of the protrusions 26 will completely fit into the space of a respective recess 24.

Moreover, at positions where a protrusion 24 is formed in the insulating potting 16b on one side of the printed circuit board 14 (bottom side in FIG. 5), a corresponding recess 26 is formed in the insulating potting 16a on the opposite side of the printed circuit board 14 (top side in FIG. 5).

This coordinated or complementary structure of protrusions 24 and recesses 26 allows to stack a plurality of SSPC cards 12_1, 12_2, 12_3 above each other in such a manner that with respect to each two adjacent SSPC cards 12 (e.g. 12_1 and 12_2, or 12_2 and 12_3) the protrusions 24 formed in the insulating potting 16b on the bottom side of the printed circuit board 14 of an upper SSPC card 12 completely fit into the recesses 26 formed in the insulating potting 16a on the top side of the printed circuit board 14 of the lower SSPC card 12. In this way, a positively locking interaction between the insulating potting 16b on the bottom side of the printed circuit board 14 of an upper SSPC card 12 with respect to the insulating potting 16a on the top side of the printed circuit board 14 of the lower SSPC card 12 can be achieved. This configuration allows a considerable increase in stiffness and mechanical robustness of the printed circuit board assembly 10 including a plurality of printed circuit boards 14 or SSPC cards 12 stacked above each other.

It goes without saying that formation of protrusions 24 in the insulating potting 16b on the bottom side of the printed circuit board 14 of an SSPC card 12 and formation of recesses 26 in the insulating potting 16a on the top side of the printed circuit board 14 of the SSPC card 12, as shown in FIG. 5, is just one example for achieving a positively locking interaction between adjacent SSPC cards 12 when stacking the SSPC cards 12 above each other. The arrangement of protrusions 24 and recesses 26 could for example be reversed, i.e. protrusions 24 could be formed in the insulating potting 16a on the top side of the printed circuit board 14 of an SSPC card 12 and recesses 26 could be formed in the insulating potting 16b on the bottom side of the printed circuit board 14 of the SSPC card 12. Also, an alternating pattern of protrusions 24 and recesses could be formed in each of the insulating pottings 16a, 16b on the top side and bottom side of the printed circuit board 14, or protrusions 24/recesses 26 of different size or shape might be formed in the insulating pottings 16a, 16b on the top side and bottom side of the printed circuit board 14, respectively. It is only required that the arrangement and design of protrusions 24 and recesses 26 is made in a coordinated or complementary manner for the insulating pottings 16a, 16b on the top side and bottom side of the printed circuit board 14, such that the pottings 16a, 16b of adjacent SSPC cards 12 fit together in a positive lock interaction when two or more SSPC cards 12 are stacked above each other.

FIG. 5 further shows a further clamping device 28 positioned at a peripheral region of SSPC cards 12_1, 12_2, 12_3 (which are made from the respective printed circuit boards 14_1, 14_2, 14_3) stacked above each other (right hand side in FIG. 5). The further clamping device 28 is clamps the SSPC cards 12_1, 12_2, 12_3 (with their respective printed circuit boards 14_1, 14_2, 14_3) together on a peripheral side of the printed circuit boards 14_1, 14_2; 14_3 opposite to the peripheral regions 18_1, 18_2, 18_3 forming male parts of card edge connectors connected to the aircraft SSPC socket 20.

In further embodiments, the clamping assembly may comprise a further clamping device on the side of the printed circuit boards opposite to the connectors (male parts of card edge connectors) connected to the aircraft SSPC socket.

FIG. 6 shows a schematic cross sectional view of a printed circuit board assembly 10 according to a further embodiment. The printed circuit board assembly 10 of FIG. 6 comprises a printed circuit board 14 having applied to its surface on the top side a first insulating potting 16a and having applied to its surface on the bottom side a second insulating potting 16b. Both insulating pottings 16a, 16b of FIG. 5 may be formed directly to the printed circuit board 14 by an additive manufacturing technique like a dam-and-fill technique (see FIGS. 7 and 8) or a 3D printing process, in the same way as all other pottings 16a, 16b disclosed herein. Each of the insulating pottings 16a, 16b is formed at its outer surface with a three dimensional surface structure forming a number of protrusions 24 with respect to a general plane P of the outer surface. By forming a three dimensional surface structure, e.g. of the type with protrusions 24 as shown in FIG. 6, the surface area of the outer surface of each of the insulating pottings 16a, 16b can be increased considerably with respect to the surface area of a flat outer surface corresponding to the general plane P of the outer surface. Thereby, heat dissipation capability of the embodiment of FIG. 6, or of any other embodiment having an outer surface formed with a three dimensional surface structure increasing surface area of the outer surface with respect to a flat outer surface, is drastically improved according to the increase in surface area of the three dimensional surface structure with respect to a flat outer surface of the insulating potting 16a, 16b.

In addition, by selecting a suitable pattern of protrusions 24, e.g a grid pattern or mesh pattern of essentially tube shaped or well shaped protrusions 24, with respect to the general plane P of the outer surface of an insulating potting 16a, 16b, mechanical stability of the SSPC card 12 resulting from applying the insulating pottings 16a, 16b to one side, or both sides, of the printed circuit board 14 can be achieved. As the amount of material of the insulating pottings 16a, 16b to be applied is minimized for embodiments, the resulting SSPC card 12 made up with the printed circuit board assembly 10 is lightweight, but nevertheless stiff and mechanically stable thanks to the grid pattern or mesh pattern of protrusions 24, which do form a framework structure. A similar effect may be obtained by forming a grid pattern or mesh pattern of recesses instead of protrusions.

Figure 7:
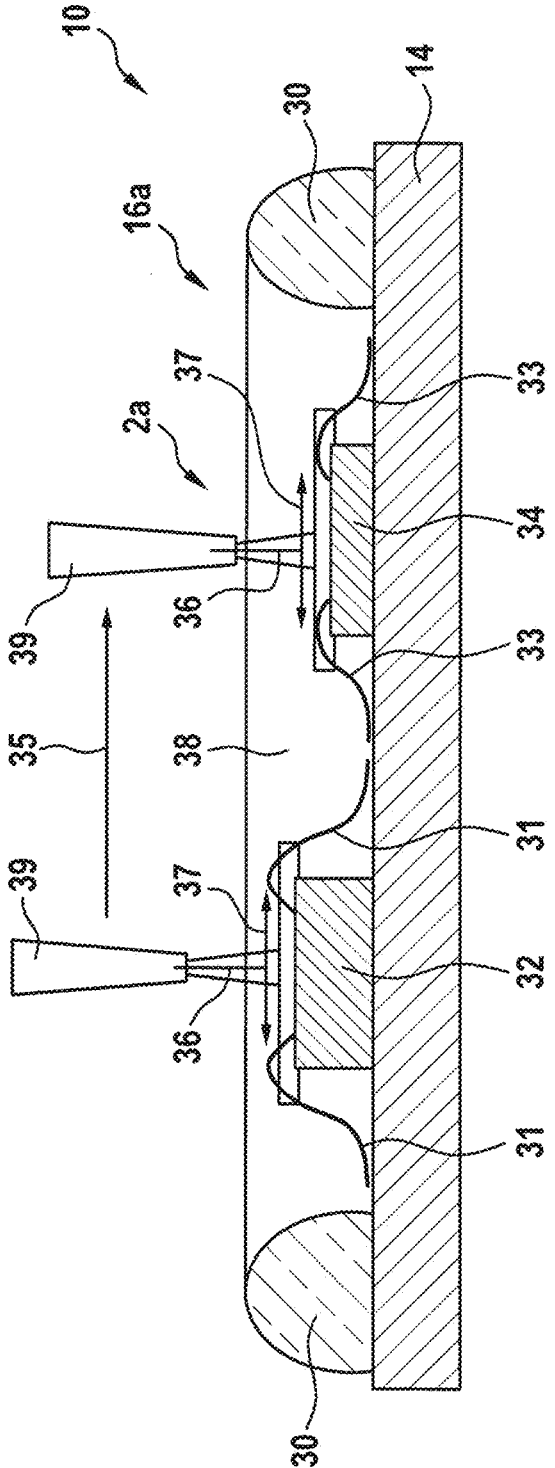
FIG. 7 shows a schematic cross sectional view of a printed circuit board assembly having an insulating potting body in the configuration of a dam and fill potting extending over the whole surface of the printed circuit board and embedding multiple heat generating electronic circuit components.

FIG. 7 shows a schematic cross sectional view of a printed circuit board assembly 10 to which an insulating potting 16a in the configuration of a dam and fill potting is applied. FIG. 7 shows the process of applying the dam and fill potting in a stage in which insulating material for forming a dam structure 30 of the insulating potting 16a has been applied to the top surface of a printed circuit board 14. On the top surface of the printed circuit board 14 are mounted at least one chip or die of a power semiconductor switch 32 (only one chip or die is shown in FIG. 7 and exemplarily designated by 32). The chip or die 32 is electrically connected to the printed circuit board 14 via its bottom side and/or via bond wires 31. It is to be understood that multiple chips or dies may be mounted on the top side of the printed circuit board 14 depending on the number of SSPC channels of the SSPC circuit 2a on the top side of the printed circuit board 14. Further, on the top surface of the printed circuit board are also mounted a number of further electric circuit components, one of which is exemplarily designated by 34 in FIG. 7. The further electric circuit component 34 is electrically connected to the printed circuit board 14 via its bottom side and/or via bond wires 33. It is to be understood that multiple further electric components 34 may be mounted on the top side of the printed circuit board 14 depending on the number and configuration of SSPC channels of the SSPC circuit 2a on the top side of the printed circuit board 14. As indicated in FIG. 7, the dam material applied in the first step of the dam-and-fill application process is applied in such a manner that the resulting dam structure 30 completely surrounds an area on the printed circuit board 14 in within which the chips or dies 32 of the power semiconductor switches and the further electric circuit components 34 are located. Once the dam structure 30 has been applied, a further insulating fill material 36 is applied to the top side of the printed circuit board to form a body 38 of the insulating potting 16a, as shown in FIG. 7. The insulating fill material 36 is applied via a nozzle 39 moving over the top surface of the printed circuit board 14 within an area enclosed by the dam structure 30 (see arrow 35 in FIG. 7). As the viscosity of the fill material 36 leaving the nozzle 39 is considerably lower than the viscosity of the material forming the dam structure 30, the fill material 36 rapidly spreads within the region bounded by the dam structure 30 (see arrows 37 in FIG. 7) and thereby creates an insulating potting body 38 completely embedding the chip or die 32 of the power semiconductor switch (i.e. all chips or dies 32 of the power semiconductor switches of the SSPC circuit 2a formed on the top side of the printed circuit board 14), as well as further electric circuit components 34.

The height of the insulating potting body 38 is less than, at most equal to, the height of the dam structure 30. The application of a dam structure 30 and/or insulating potting body 38 may be repeated several times to end up with an insulating potting 16a having a thickness and surface configuration as desired. The insulating potting 16a finally extends over the whole surface of the printed circuit board 14 and embeds multiple heat generating electronic circuit components 32, 34.

Figure 8:
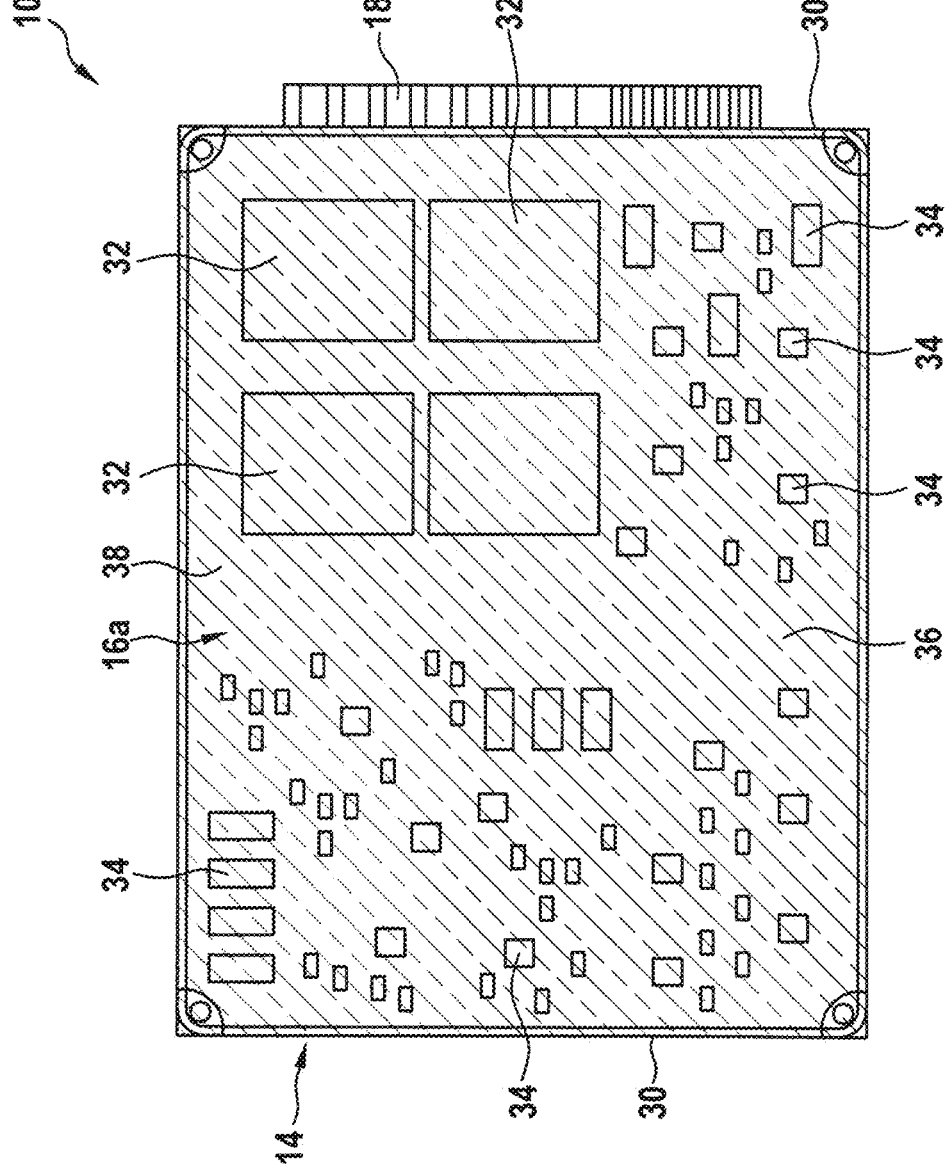
FIG. 8 shows a schematic top view of a printed circuit board assembly having an insulating potting body in the configuration of a dam and fill potting extending over the whole surface of the printed circuit board and embedding multiple semiconductor power switch dies.

FIG. 8 shows a schematic top view of a printed circuit board assembly 10 having an insulating potting 16a in the configuration of a dam and fill potting, created as shown in the cross section of FIG. 7. The insulating potting 16a is applied by first applying a dam structure 30 surrounding the portion of the printed circuit board 14 on which heat generating electric circuit components are mounted, particularly chips or dies 32 of power semiconductor switches and further electric circuit components 34 (for sake of clarity, only a few these further electric circuit components have been designated by 34 in FIG. 8). Once the dam structure 30 has been applied to the printed circuit board 14, an insulating fill material 36 is applied such that the insulating fill material 36 spreads out and finally completely fills the space enclosed by the dam structure 30 to provide the insulating potting body 38, together with the dam structure 30. The insulating potting body 38 extends over the whole surface of the printed circuit board 14 except for peripheral regions 18 forming male parts of card edge connectors, as described herein. The insulating potting body 38 embeds multiple semiconductor power switch dies 32.

Figure 9:
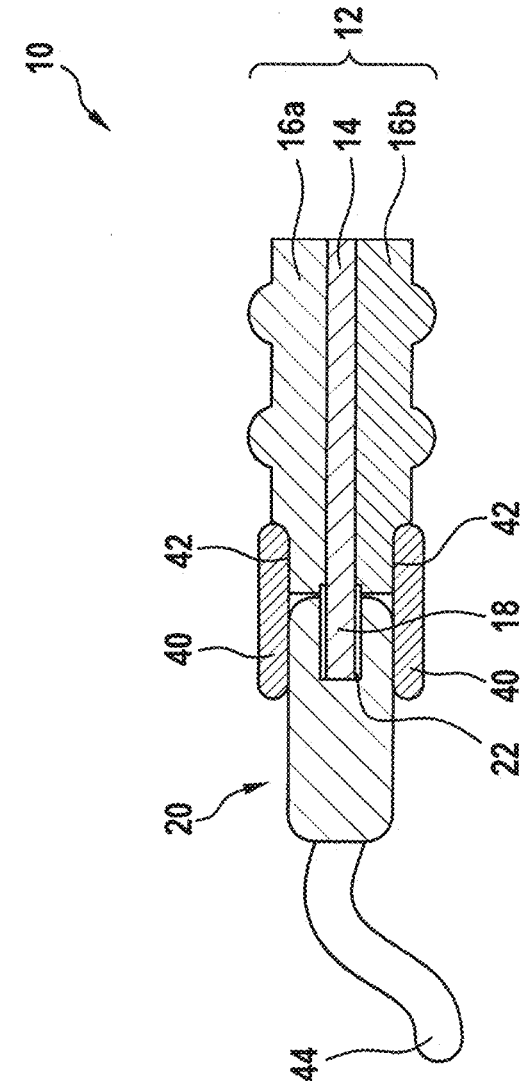
FIG. 9 shows a schematic cross sectional view of a printed circuit board assembly according to a further embodiment provided with a card edge connector and an insulating potting having a three dimensional surface structure which allows to connect a male part of the card edge connector to a female connector of an aircraft SSPC socket in a fluid tight manner.

FIG. 9 shows a schematic cross sectional view of a printed circuit board assembly 10 according to a further embodiment. In FIG. 9 the printed circuit board 14 is provided with a first insulating potting 16a applied to a first surface of the printed circuit board 14 on its top side and with a second insulating potting 16b applied to a second surface of the printed circuit board 14 on its bottom side, to form an SSPC card 12, as described above. The insulated pottings 16a, 16b both have a three dimensional structure formed on their outer surfaces, as described above, particularly with respect to FIG. 6. The printed circuit board 14 further comprises a peripheral portion 18 not covered by the insulating pottings 16a and 16 and forming a male part of a card edge detector, as also described above.

Also shown in FIG. 9 is an SSPC socket 20 comprising a female part 22 of the card edge connector. FIG. 9 shows the card edge connector in a configuration with the male part 18 plugged into the female part 22 thus establishing an electric connection between the SSPC card 12 and respective loads, power supply, and controls (see line 44 in FIG. 9). The card edge connector of FIG. 9 allows to connect the male and female parts thereof in fluid tight manner, particularly in a watertight manner. Specifically, the SSPC socket 20 includes a pair of flanges 40 arranged on both sides of the female part 22 of the card edge connector and projecting from the female socket 22 towards the printed circuit board 14 to such an extent that the flanges 40 overlap the insulating pottings 16a and 16b in a condition in which the peripheral region 18 forming the male part of the card edge connector is plugged in the female socket 20 to establish an electric connection. In this condition, the flanges 40 of the SSPC socket 20 engage with the outer surfaces of the pottings 16a and 16b to create a fluid tight seal by abutment of the flanges 40 with the pottings 16a and 16b (see reference signs 42 in FIG. 9 indicating sealing regions created by abutment of the flanges 40 to outer surfaces of the pottings 16a, 16b). Fluid tightness of such seals may be increased by appropriately structuring a surface profile of the insulating pottings 16a, 16b in such regions where sealing regions 42 will be established by abutment of flanges 40, e.g. in the way of providing sealing lips or labyrinth seal structures by the pottings 16a, 16b. It is also conceivable to provide the pottings 16a, 16b with structures suitable for accommodating a seal (e.g. an O-ring) in those regions 42 that come into abutment with flanges 40. It is also possible to provide flanges 40 with suitable structures or sealing elements (like an O ring) for achieving good seal when the flanges 40 abut the pottings 16a, 16b. Thereby, the insulating pottings 16a, 16b have a three dimensional surface structure which allows to connect a male part 18 of the card edge connector to a female connector 22 of an aircraft SSPC socket 20 in a fluid tight manner.

It is noted that a card edge connector allowing to connect the male and female parts thereof in fluid tight manner, particularly in a watertight manner, as shown in FIG. 9, can be realized for a stack of multiple printed circuit boards forming SSPC cards, respectively, and a corresponding aircraft SSPC socket 20, as shown in FIGS. 3, 4 and 5. In such embodiments, the SSPC socket 20 includes a plurality of pairs of flanges 40 arranged on both sides of each of the female parts 22 of the card edge connectors formed therein, respectively, and projecting from the respective female part towards the respective printed circuit board to be accommodated to such an extent that the flanges 40 overlap the insulating pottings 16*a* and 16*b* of the respective printed circuit board in a condition in which the peripheral region 18 forming the male part of the card edge connector is plugged in the female part of the card edge connector to establish an electric connection. As described above with respect to FIG. 9, fluid tightness of such seals may be increased by appropriately structuring a surface profile of the insulating pottings 16*a*, 16*b* in such regions where sealing regions 42 will be established by abutment of the respective flanges 40, e.g. in the way of providing sealing lips or labyrinth seal structures by the pottings 16*a*, 16*b*. Reference is made to the above considerations with respect to FIG. 9 which equally apply with respect to each of the printed circuit boards of a stack of multiple printed circuit boards forming SSPC cards, respectively, and a corresponding aircraft SSPC socket 20 with female card edge connector parts for each of the stacked printed circuit boards.

The embodiments described provide an improved configuration for a printed circuit board assembly 10 forming an SSPC card 12 which is highly compact, lightweight and simple. Particularly, this configuration allows more efficient assembly of the SSPC and/or better utilization of available space on an aircraft while still providing sufficient heat dissipation capability.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

The invention claimed is:

1. A printed circuit board assembly for an aircraft solid state power controller (SSPC), comprising:
   at least one printed circuit board having a top side and a bottom side,
   a surface layer on at least one of the top side and the bottom side, the surface layer being made from an electrically conductive material;
   a plurality of heat generating electronic circuit components mounted on a same side as the surface layer; and
   an insulating potting that covers the plurality of heat generating electronic circuit components on the at least one of the top side and the bottom side, the insulating potting comprising an insulating potting body covering the plurality of heat generating electronic circuit components in a contiguous manner;
   wherein the insulating potting body is made from an insulating polymeric material;
   wherein the insulating potting body comprises:
   an insulating dam material having a viscosity of between $50×10^3$ mPas and $1000×10^3$ mPas; and
   an insulating fill material having a viscosity of between 10 mPas and $49×10^3$ mPas.

2. The printed circuit board assembly for an aircraft solid state power controller (SSPC) according to claim 1, wherein the plurality of heat generating electronic circuit components comprise a power semiconductor switch of a respective power distribution channel of the aircraft SSPC.

3. The printed circuit board assembly for an aircraft solid state power controller (SSPC) according to claim 1, wherein the insulating potting body has the configuration of a dam and fill potting.

4. The printed circuit board assembly for an aircraft solid state power controller (SSPC) according to claim 1, wherein the insulating potting comprises a single insulating potting body forming a contiguous potting covering the top side and/or the bottom side of the printed circuit board.

5. The printed circuit board assembly for an aircraft solid state power controller (SSPC) according to claim 1, wherein the at least one printed circuit board is configured to form a male part of a card edge connector in at least one peripheral region thereof.

6. The printed circuit board assembly for an aircraft solid state power controller (SSPC) according to claim 1, wherein the insulating potting body is formed with a three dimensional structure on its side facing away from the printed circuit board.

7. The printed circuit board assembly for an aircraft solid state power controller (SSPC) according to claim 6, wherein the three-dimensional structure includes at least one predetermined pattern of protrusions and/or recesses, thereby forming any of at least one reinforcing rib, at least one grid structure and/or at least one mesh structure, or combinations thereof.

8. A printed circuit board assembly for an aircraft solid state power controller (SSPC), comprising:
   at least one printed circuit board having a top side and a bottom side,
   a surface layer on at least one of the top side and the bottom side, the surface layer being made from an electrically conductive material;
   a plurality of heat generating electronic circuit components mounted on a same side as the surface layer; and
   an insulating potting that covers the plurality of heat generating electronic circuit components on the at least one of the top side and the bottom side, the insulating potting comprising an insulating potting body covering the plurality of heat generating electronic circuit components in a contiguous manner;
   wherein the insulating potting body is formed with a three dimensional structure on its side facing away from the printed circuit board;
   wherein the three-dimensional structure includes at least one predetermined pattern of protrusions and/or recesses, thereby forming any of at least one reinforcing rib, at least one grid structure and/or at least one mesh structure, or combinations thereof;
   the SSPC further comprising an insulating potting on each of the top side and bottom side of the printed circuit board, wherein the insulating potting on the top side is formed with a first three dimensional structure on its side facing away from the printed circuit board, and the insulating potting on the bottom side is formed with a second three dimensional structure on its side facing away from the printed circuit board, wherein the first and second three dimensional structures are coordinated with each other or complementary to each other.

9. The printed circuit board assembly for an aircraft solid state power controller (SSPC) according to claim 8, comprising at least two printed circuit boards stacked above each other.

10. The printed circuit board assembly for an aircraft solid state power controller (SSPC) according to claim 9, further comprising:

at least one clamping assembly positioned at a peripheral region of the printed circuit boards stacked above each other and configured to clamp the printed circuit boards together.

11. The printed circuit board assembly for an aircraft solid state controller (SSPC) according to claim 10, further comprising:

an aircraft SSPC socket comprising a plurality of plug-in board connectors, each each of the plug-in board connectors configured for accommodating a respective one of the printed circuit boards of the plurality of printed circuit boards, wherein the clamping assembly comprises the aircraft SSPC socket.

12. A method of manufacturing a printed circuit board assembly for an aircraft solid state power controller (SSPC), comprising providing at least one printed circuit board having a top side and a bottom side, at least one of the top side and the bottom side having a surface layer made from an electrically conductive material and a plurality of heat generating electronic circuit components mounted thereon, and potting an insulating material to the at least one of top side and/or bottom side of the printed circuit board such as to cover the plurality of heat generating electronic components, thereby producing an insulating potting having the configuration of an insulating potting body covering the plurality of heat generating electronic circuit components in a contiguous manner;

wherein potting an insulating material to the top side and/or bottom side of the printed circuit board such as to cover the plurality of heat generating electronic components comprises providing the insulating potting body in the configuration of a dam and fill potting by:

first applying to the top side and/or bottom side of the printed circuit board an insulating dam material having a viscosity of $50 \times 10^3$ mPas or more, particularly of $100 \times 10^3$ mPas or more, preferably of $110 \times 10^3$ mPas or more, particularly at most $1000 \times 10^3$ mPas, and providing a dam structure forming at least one space enclosed by the insulating dam material; and then, after applying, filling structures enclosed by the dam structure of insulating dam material with an insulating fill material having a viscosity of $49 \times 10^3$ mPas or less, particularly of $30 \times 10^3$ mPas or less, preferably of $20 \times 10^3$ mPas or less, particularly of at least 10 mPas; or forming the insulating potting body with a three dimensional structure on its side facing away from the printed circuit board.

* * * * *